United States Patent [19]

Dershem et al.

[11] Patent Number: 5,232,962
[45] Date of Patent: Aug. 3, 1993

[54] ADHESIVE BONDING COMPOSITION WITH BOND LINE LIMITING SPACER SYSTEM

[75] Inventors: Stephen M. Dershem; Jose A. Osuna, Jr., both of San Diego, Calif.

[73] Assignee: Quantum Materials, Inc., San Diego, Calif.

[21] Appl. No.: 774,417

[22] Filed: Oct. 9, 1991

[51] Int. Cl.$^5$ .................. C08L 63/00; C08K 3/08; C08K 3/40

[52] U.S. Cl. .................. 523/442; 523/444; 524/439; 524/440; 524/441; 524/494

[58] Field of Search .............. 523/442, 444; 524/439, 524/440, 441, 474, 847

[56] References Cited

U.S. PATENT DOCUMENTS

| | | |
|---|---|---|
| 4,097,445 | 6/1978 | Martins et al. ............... 524/440 |
| 4,428,867 | 1/1984 | Billias et al. ................ 523/442 |
| 4,569,961 | 2/1986 | Oezelli et al. ............... 528/52 |
| 4,636,254 | 1/1987 | Husson, Jr. et al. .......... 252/514 |
| 4,761,224 | 8/1988 | Husson, Jr. et al. .......... 252/514 |
| 4,925,510 | 5/1990 | Hojo et al. .................. 523/442 |
| 4,968,738 | 11/1990 | Dershem .................... 524/439 |

FOREIGN PATENT DOCUMENTS

| | | | |
|---|---|---|---|
| 0168042 | 9/1984 | Japan ................ 524/441 |
| 0001221 | 1/1985 | Japan ................ 524/440 |
| 0001275 | 1/1985 | Japan ................ 524/440 |
| 0133057 | 7/1985 | Japan ................ 524/440 |
| 0141045 | 6/1989 | Japan ................ 524/439 |

*Primary Examiner*—Paul R. Michl
*Assistant Examiner*—Peter Szekely
*Attorney, Agent, or Firm*—Baker, Maxham, Jester & Meador

[57] ABSTRACT

An adhesive bonding composition with bond line limiting spacer system includes an adhesive paste composition having a hardenable adhesive component, and a plurality of spacer elements distributed in the adhesive paste composition. The spacer elements are sized to provide a self-limiting bond line thickness between the surfaces to be bonded, the bond line thickness being maintained at a selected lower limit by the spacer elements.

10 Claims, 2 Drawing Sheets

ADHESIVE BONDING COMPOSITION WITH BOND LINE LIMITING SPACER SYSTEM

BACKGROUND OF THE INVENTION

The present invention relates to the art of adhesive bonding, and more particularly, to the bonding of surfaces wherein the control of bond line thickness is desirable, as for example, in the art of packaging semiconductor devices.

Adhesive pastes have been used in the semiconductor packaging industry in a variety of applications. Epoxy pastes, for example, have been used to secure heat sinks to ceramic semiconductor packages. In addition, metallic-glass pastes have been used for attaching semiconductor chips to ceramic substrates in the manufacture of semiconductor devices, and particularly, large scale integrated (LSI) and very large scale (VLSI) circuits. These circuits typically include a semiconductor chip or die, e.g., silicon, gallium arsenide, etc., which is bonded to a supporting ceramic substrate. Commonly assigned U.S. Pat. Nos. 4,636,254, 4,761,224 and 4,968,738 are directed to improved silver-glass die attach pastes for the attachment of a semiconductor die to a ceramic substrate. These patents disclose silver-glass die attach pastes consisting generally of a mixture of silver flake and glass frit distributed in an organic vehicle including a suitable organic resin and a suitable organic solvent. To form a bond between a semiconductor die and a ceramic wafer substrate, a selected quantity of the silver-glass paste is placed between the opposing die and substrate surfaces in a sandwiched relationship. The sample is dried and fired in a oven or furnace at temperatures above the glass transition temperature ($T_g$) of the glass constituent. During the drying and firing stages, the organic vehicle volatilizes and the glass flows to wet the ceramic substrate and die, while the silver flake sinters together. Upon cooling, the result is a secure bond between the die and the substrate.

One critical aspect of the semiconductor die/ceramic substrate bonding process is that the post-fired adhesive film must have an adequate bond line thickness. If the bond line thickness is sufficient, the resultant bond will exhibit good resistance to differential thermal expansion rates between the die and substrate and will produce a bond having a high tensile strength. Interfacial stress that arises from a thermal mismatch between the die and substrate is directly proportional to both the area of attachment and the modulus of elasticity of the bonding adhesive. This stress is also inversely proportional to the bond line thickness. Since the modulus of elasticity for a given die attach adhesive is fixed, the only avenue available to reduce interfacial stress is to maintain a sufficient bond line thickness on each part assembled. For the proper bonding of silicon dice to ceramic substrates, the bond line thickness must be increased proportionally to the area of the surfaces to be bonded.

It is a characteristic of metal-glass pastes that the paste collapses during drying and firing as the organic materials are eliminated from the composition. The amount of shrinkage varies from case to case. However, if a sufficiently large wet bond line thickness is initially maintained, post-fired bonds exhibiting suitable strength and thermal stress resistance characteristics may be obtained.

In production scale semiconductor packaging operations, the control of wet bond line thickness has proven problematic. In some cases, spacing control equipment is not always available. In other cases, the equipment, although available, is not always useable (as, for example, in packages with minimal spacing between the die and the cavity wall). This inability to adequately control wet bond line thickness may result in production runs wherein the final (fired) bond line thickness is inadequate. These items may fail adhesion testing, in which case they must be discarded. To overcome this problem, manufacturers have resorted to applying excess amounts of paste to the die-substrate interface. This, of course, needlessly increases the amount of paste utilized, and significantly extends the required processing time.

Accordingly, a practical solution to the problem of bond line control in the packaging of semiconductor devices would be desirable. Of course, the bond line thickness problem is not limited to metal-glass pastes alone, but may be experienced to varying degrees in other compositions such as epoxy and the like. Thus, a bond line control mechanism for applications utilizing epoxy and other adhesives is also required.

SUMMARY OF THE INVENTION

It is therefore the primary object of the present invention to provide an improved bonding composition for adhesively bonding a pair of surfaces while controlling bond line thickness.

It is a further object of the present invention to provide an improved bonding composition having a self-limiting wet bond line control mechanism therein which provides an adhesive bond having comparable adhesion and stress resistance to bonds wherein wet bond line thickness is controlled by conventional methods.

To that end, in accordance with preferred aspects of the invention, a bonding composition for providing an adhesive bond includes an adhesive paste having a hardenable adhesive component, and a plurality of spacer elements dispersed in the adhesive paste composition. The spacer elements are sized to provide a self-limiting wet bond line thickness between the surfaces to be bonded, the wet bond line thickness being maintained at a selected lower limit by the spacer elements.

DETAILED DESCRIPTION OF PREFERRED EMBODIMENTS

Unless otherwise specified, all percentages herein are given by weight.

Figure 1:
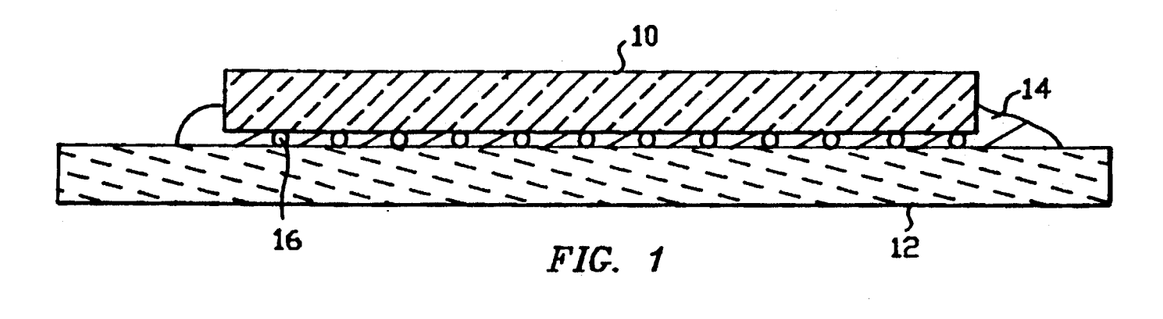
FIG. 1 is a diagrammatic illustration of a cross-section of a silicon die that is wet bonded (prior to drying/firing) to a ceramic substrate by a quantity of silver-glass die attach paste having a plurality of spacer elements dispersed (or distributed) therein. The drawing is not to scale.

Referring now to FIG. 1, a pair of structures 10 and 12 may be bonded at respective opposing surfaces thereof using an adhesive bonding material 14 that includes a plurality of spacer elements 16 distributed therein. The adhesive vehicle and spacer elements may be formed from many different materials depending on the nature of the materials to be bonded and the bonding composition itself. For example, if the bonding composition is an epoxide bonding compound that does not shrink during curing, the spacer elements may be noncollapsible spacer elements of generally spherical shape and formed from any suitable material which does not react with the epoxy vehicle and which is strong enough to maintain the desired bond line thickness. It is contemplated that noncollapsible spacer elements could be used with a wide variety of epoxide compounds and thermo-set materials. For example bonds formed from HEXCEL EPOLITE #6400 (Hexcel Corporation) have been formed with spherical lead spacer elements. If the bonding composition is one which undergoes shrinkage during the bond formation process, such as metal-glass paste, the use of non-collapsible spacer elements may lead to the formation of voids because the bonding composition no longer fills the interface between the surfaces to be bonded. In that case, the concept of a collapsible spacer element must be employed.

In a preferred embodiment of the present invention, a bonding composition is formed that includes a metal-glass paste and collapsible spacer elements that are preferably spherical in shape, although other shapes could no doubt also be used. The metal-glass paste provides a support composition preferably consisting of approximately 60 to 85% silver flake, approximately 7 to 20% glass frit having a softening temperature of less than about 400 degrees C., approximately 0 to 2% resin and approximately 6 to 20% organic solvent (or an organic nonsolvent, such as siloxane fluid). The paste further includes a plurality of collapsible spacer elements which have a relatively low softening or melting temperature. By use of the term "collapsible", it will be understood that the spacer elements soften or melt during the drying/firing process by which the paste is cured. The collapsible spacer elements may be selected from a range of materials and used in conjunction with the above-described metal-glass paste provided the spacer elements do not react with the organic materials in the paste, and provided the collapsible elements have a sufficiently low melting or softening point that does not substantially inhibit the shrinkage of the adhesive paste or film during drying and firing. Thus, the spacer elements should begin to soften and melt relatively early in the drying/firing process so that void formation is minimized. Voids would occur, for example, where the spacer elements do not collapse quickly enough and the organic vehicle shrinks away from the spacer elements because, volumetrically, the remaining vehicle and silver-glass mix cannot fill the space maintained by the spacer elements between the bonded surfaces. Collapsibility, then, is a function of the softening temperature of the spacer and the shrinkage characteristics of the adhesive paste composition. With an appropriate collapsible spacer, the resultant adhesive bond, after drying/firing and cooling, should have a void percentage of not more than substantially 15% and a tensile strength of not less than substantially 200 psi.

Two general types of collapsible spacer elements have been determined to provide satisfactory results in an adhesive bond, those being spacers made from metal on one hand and plastic on the other. Suitable metals for use as collapsible spacers include relatively low melting point alloys, such as Wood's metal and other solder-like alloys, having a relatively low melting temperature ($T_m$). Test results indicate that a melting temperature of not less than around 35 degrees C., nor more than around 100 degrees C. is optimal, although it will be understood that other spacer materials with lower or higher melting temperatures may well be determined to be useful in accordance with the present invention. The plastics determined to be useful as collapsible spacer elements may be categorized as non-charring, solvent-resistant, depolymerizable polymers having a relatively low softening or glass transition temperature $T_g$. Test results indicate that a glass transition temperature of not less than around 35 degrees C., nor more than about 105 degrees C. is optimal, although spacer elements with lower or higher glass transition temperatures may well be determined to be useful in accordance with the present invention. Within this group, successful pastes have been prepared using collapsible spheroids made from polypropylene carbonate and polyalkyl methacrylate resins. Among these polymers, the polyalkyl methacrylate has provided superior results, but must be used with a nonsolvent, such as siloxane fluids, due to its solubility in other organic liquids.

In the following examples, bonding compositions employing polyalkyl methacrylate, polypropylene carbonate and metallic spacer elements were tested against control groups of identical composition, but without the spacer elements. The bonding compositions were used to form adhesive bonds between silicon wafer and ceramic substrate surfaces. Fixed wet bond line thicknesses were set by use of a flange micrometer in the bonds made from the control compositions. In the compositions with spacer elements, the wet bond line was controlled by the spacer elements themselves. The resultant bonds were tested for post-firing bond line thickness, adhesion and void rating. A successful bond is one which provides comparable results to the control composition, which, in each case, was closely controlled to provide optimum adhesive performance. Comparable performance by the test bond confirms the bond's ability to provide adequate bond properties without the need for wet bond line control equipment or excessive amounts of bonding material.

Bond line thicknesses were measured in mils, adhesion was measured in lbs force and void rating was based on a rating scale from 0 to 5, wherein a void rating of 0 is the best possible score and a void rating of 5 is the worst possible score, as follows:

0 - no visible voiding
1 - very slight voiding
2 - visible but acceptable voiding
3 - marginally acceptable voiding
4 - excessive voiding
5 - totally unacceptable voiding Because in semiconductor packaging, a void ratio of 15% is considered the limit of acceptability, a void rating of 4 on the scale above would roughly correspond to a void ratio in excess of 15%. As will be seen below, all of the samples tested exhibited void ratings well within the range of acceptability.

EXAMPLE I

Polyalkyl Methacrylate Spacer Elements

A rectangular silicon die having dimensions of 300×300 mils was bonded to a ceramic substrate. A silver-glass paste composition containing two types of silver flake at a one-to-one ratio, a low temperature lead borate glass frit, and an organic vehicle, was combined with a plurality of collapsible polyisobutyl methacrylate resin spacer beads. The silver flake material was type 15ED and type 26LV flake from Degussa Metz Metallurgical Co., having respective mesh sizes of −100 mesh and −200 mesh. The lead borate glass frit (Pbo $B_2O_3$) was produced by Ferro Corp. The glass particles had a surface area of about 0.15 to 3.0 $m^2/g$ and measured 2-17 microns across. Other low temperature glass, i.e., with a softening point below 400 degrees C., may also be used. The organic vehicle was a 3:1 mixture of dodecamethylcyclohexasiloxane (D6) available from Dow Corning Corp. under the designation X2-1494, and a 5 centistoke linear siloxane fluid also available from Dow Corning Corp. under the designation 200 FL5CS. The polyisobutyl methacrylate beads were obtained from Dupont Co., Specialty Products Division, Methacrylate Products Group, under the designation ELVACITE 2045. The beads were spherical in shape and size classified to a mesh size of −100 +200 mesh. Their glass transition temperature $T_g$ was about 55 degrees C. The bonding composition consisted of 99.9% silver-glass paste to which 0.1% spacer beads were added. Set forth hereafter in Table 1 are the weight percent parameters of the exact formulation of the composition that was tested:

TABLE 1

| Component | Weight Percent |
| --- | --- |
| Metz Ag flake 15ED | 35.93% |
| Metz Ag flake 26LV | 35.93% |
| Ferro PboB$_2$O$_3$ | 18.04% |
| Dow X2-1494 (D6) | 7.5% |
| Dow 200 FL5CS (linear) | 2.5% |
| ELVACITE 2045 Beads | 0.10% |

The paste composition (without ELVACITE 2045) was prepared in accordance with conventional methods for producing silver-glass die attach paste. Commonly assigned U.S. Pat. Nos. 4,636,254, 4,761,224 and 4,968,738 illustrate those techniques. Thereafter, the ELVACITE 2045 was mixed in and dispersed through the paste. The bonding composition was applied between opposing surfaces of the silicon and ceramic structures at a wet bond line thickness of 5 mils (controlled by the spacer elements) and fired at a peak temperature of 425 degrees C. for eight minutes.

Set forth hereafter in Tables 2 and 3 is a comparison of the fired bond line thickness (FBL), the adhesive strength and the void rating of the die attach composition with polyisobutyl methacrylate spacer elements in comparison to a control composition without spacers. The bond line spacing in the control paste was set to 5 mils using a test fixture having a flanged clutch micrometer adjusted to the appropriate bond line thickness. As noted, the bond line thickness for the spacer containing paste was controlled by the beads themselves. Each table includes test values for ten specimens, together with the average value ($\bar{x}$) for each of the three measured characteristics. In addition, a standard deviation ($\sigma_{n-1}$) and range of adhesion values (R) are provided for the adhesion results. The results of the control test are set forth hereafter in Table 2, as follows:

TABLE 2

| | (Control) | |
| --- | --- | --- |
| FBL | Adhesion | Void Rate |
| 2.25 | 175 | 0 |
| 2.80 | 179 | 0 |
| 2.20 | 128 | 0 |
| 2.65 | 144 | 0 |
| 2.40 | 142 | 1 |
| 2.85 | 166 | 0 |
| 2.75 | 142 | 1 |
| 2.60 | 144 | 1 |
| 2.45 | 181 | 0 |

TABLE 2-continued

| | (Control) | |
| --- | --- | --- |
| FBL | Adhesion | Void Rate |
| 2.55 | 173 | 1 |
| $\bar{x} = 2.55$ | $\bar{x} = 157.4$ | $\bar{x} = 0.4$ |
| | $\sigma_{n-1} = 19.3$ | |
| | R = 128.0-179.0 | |

TABLE 3

| | (Composition With Spacers) | |
| --- | --- | --- |
| FBL | Adhesion | Void Rate |
| 2.45 | 163 | 1 |
| 3.40 | 181 | 1 |
| 3.00 | 218 | 1 |
| 2.10 | 181 | 1 |
| 2.10 | 177 | 1 |
| 2.65 | 158 | 1 |
| 2.10 | 156 | 1 |
| 3.50 | 201 | 1 |
| 2.95 | 164 | 1 |
| 2.15 | 150 | 1 |
| $\bar{x} = 2.64$ | $\bar{x} = 175.0$ | $\bar{x} = 1$ |
| | $\sigma_{n-1} = 21.3$ | |
| | R = 151.0-218.0 | |

The above results indicate that the polyisobutyl methacrylate spacer composition exhibits superior tensile strength and provides a bond line thickness in excess of that provided by the control composition. In addition, the void percentage, though slightly higher than that of the control, is well below the 15% void ratio required for semiconductor packaging. It will also be noted, as discussed above, that the bond line used in the control was set by a clutch micrometer at what was considered optimum for adhesive performance. In the absence of this ability to externally maintain wet bond line thickness in the control, adhesive performance would have been compromised. The composition with spacer elements required no such external bond line control.

EXAMPLE II

Polycarbonate Spacer Elements

A rectangular silicon die having dimensions of 500×500 mils was bonded to a ceramic substrate. A silver-glass paste composition was mixed with collapsible spacer elements made from a low molecular weight polypropylene carbonate resin. The silver-glass paste was made from a mixture of four silver flake types obtained from Degussa Metz Co. under the designations 5SB, 67, 26LV and 50-S. The paste also included the Ferro lead borate glass frit used in Example I, and an organic solvent mixture. The organic solvents employed were alpha terpineol from Hercules Inc., and the ester alcohol 2,2,4-trimethyl-1, 3-pentanediol isobutyrate (and its mono isobutryrate), sold under the trademarks TEXANOL and TEXANOL ISOBUTYRATE by Eastmann Chemical Products, Inc. The spacer elements were produced from QPAC-40L resin from Air Products and Chemicals, Inc.

Figure 2:
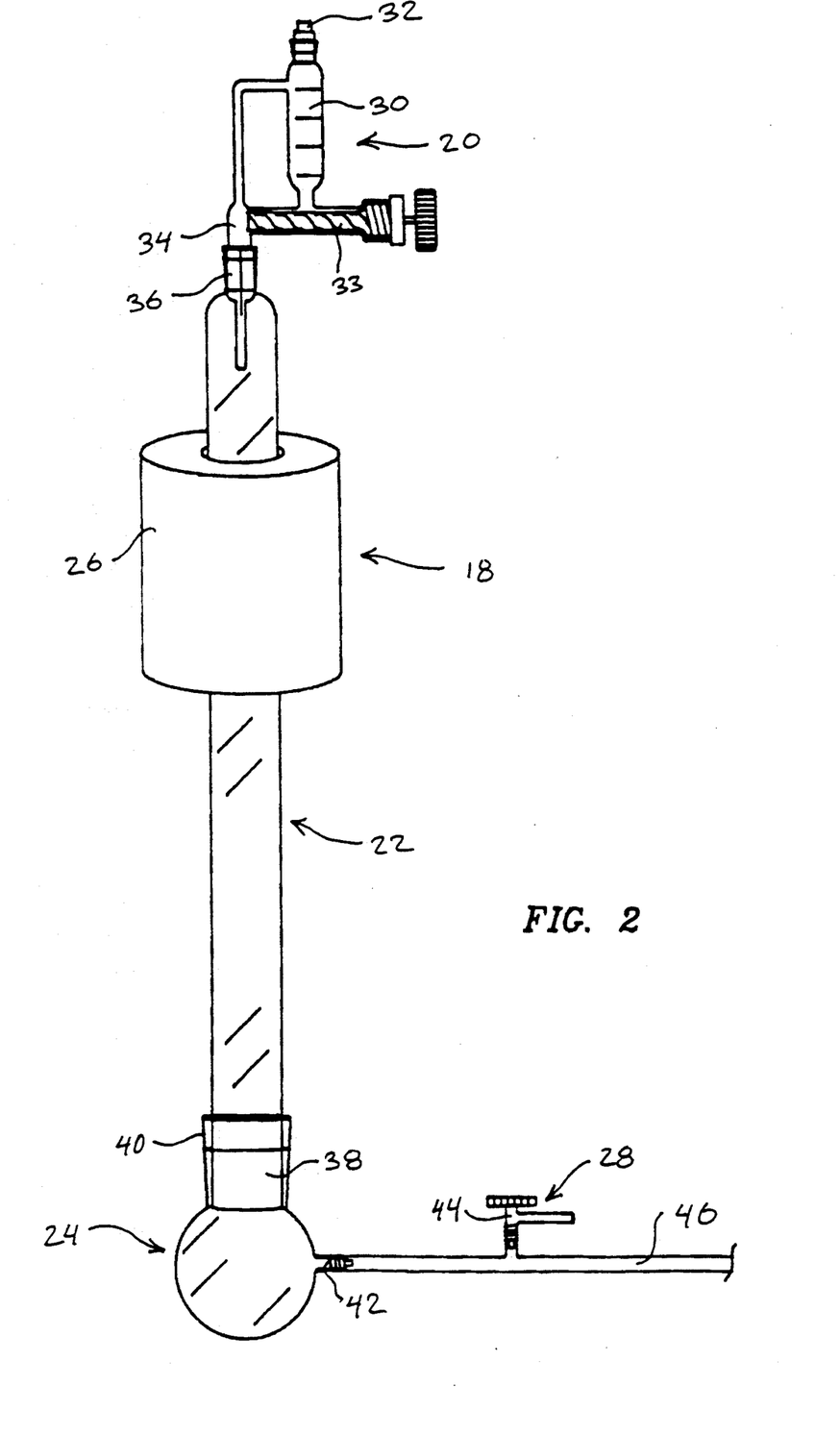
FIG. 2 is a side elevation view of an apparatus for making polypropylene carbonate spacer elements in accordance with one aspect of the present invention.

The polypropylene carbonate resin is not available in spherical form. It was therefore necessary to produce resin beads for use as spacers. Referring now to FIG. 2, the polypropylene carbonate resin beads were prepared by sequentially passing fragmented resin particles through heated and non-heated segments of a vertical evacuated chamber apparatus 18, such that the resin particles were fused and then cooled to form spherical beads. The equipment used consisted of an addition funnel 20, a dropping tube 22, a receiving flask 24, a tube furnace 26 and a bleeder valve 28. The addition funnel 20 was a 125 ml pressure equilibrating powder funnel capable of negative pressure. The funnel 20 included a graduated addition chamber 30 having an upwardly extending fitting into which a stopper 32 was inserted. The funnel 20 further included a screw valve 33 positioned at the bottom of the addition chamber 30 for regulating the flow of resin material into a funnel outlet chamber 34. A small glass collimating tube was attached to the bottom of the funnel outlet chamber 34 which constricted the outlet to 5 mm in diameter. The funnel functioned to regulate, under vacuum, a fine stream of resin mix to the center of the dropping tube 22.

The dropping tube 22 was a heavy walled pyrex tube capable of withstanding negative pressures of 1 mm $h_g$ and a maximum working temperature of 500 degrees C. It was approximately 4–5 feet in length and had a two inch internal diameter (ID). The dropping tube 6 functioned to create a static and inert space which the resin particles traversed. The tube was selected to be long enough to allow the falling particles enough time in the heating zone to fuse or soften and to allow the particles to cool before reaching the receiving flask. The tube 22 included a partially constricted 24/40 ground glass fitting 36 to receive the funnel outlet 34. An enlarged outlet 38 of the tube 22 minimized resin mix build-up between the tube and the receiving flask 24. The receiving flask itself was a round bottom flask fitted with a 45/50 ground glass joint 40 and a ½ inch outside diameter (OD) barbed fitting 42. The vertical tube furnace 26 had an overall length of 16 inches and an inside diameter of approximately 2.5 inches, and was positioned over the upper portion of the dropping tube 22. The furnace's variable temperature ranged from ambient to 500 degrees C. The bleeder valve 28 includes a TEFLON needle valve 44 with a ½ inch OD barbed fitting. The bleeder valve 28 was mounted to a vacuum line 46 connected at one end to the barbed fitting 42 and at the other end to a vacuum source (not shown), to precisely control the rate of decreasing or increasing pressure in the system. This precise control was necessary so as not to dust the resin mix.

The QPAC 40L polymer was prepared by placing it in a clean, dry stainless steel blender container fitted with a standard household blender motor. Liquid nitrogen was slowly added to the container to freeze the polymer. The frozen polymer was ground for approximately five minutes at high shear, with liquid nitrogen being occasionally added to refreeze the polymer. Using appropriate sieve meshes and a conventional ROTAP sieve-shaking device, the ground resin was sieved for approximately five to ten minutes to isolate the desired particle sizes. An anti-sticking agent (CAB O SIL EH-5 fumed silica) was added at 5% (wt) to the ground polymer and mixed thoroughly. The fumed silica sticks to the particles, keeping the particles free flowing and eliminating sticking of the polymer to itself at room temperature. The resin mix was stored in a cool and dry place.

The equipment was assembled following appropriate cleaning and drying of all glassware. The tube furnace 10 was initially secured using a supporting stand and chain clamp (not shown). The dropping tube was positioned so that the 24/40 ground glass fitting was approximately 10–12 inches above the top of the furnace. The dropping tube 22 was secured to the furnace 26 and furnace support structure using heat insulated clamps (not shown). The bottom of the dropping tube 22 was lightly greased and the receiving flask 24 was placed onto the tube and rotated to distribute the grease evenly over the ground fitting 40. All ground glass fittings were sealed in this manner. To the top of the dropping tube 22 was added the addition funnel 20. The vacuum line 46 with the bleeder valve 28 was attached to the receiving flask 24. An aluminum foil heat shield (not shown) was placed approximately six inches above the tube furnace 26 to help keep rising warm air from warming the addition funnel 20.

With the apparatus prepared, a full vacuum was pulled on the apparatus (approximately 1 mm $H_g$) and the power to the tube furnace was activated to bring the temperature to 450–475 degrees C. With the furnace at temperature, the bleeder valve 28 was opened and the pressure was increased to ambient in the dropping tube. The stopper 32 on top of the addition funnel 20 was quickly removed and the prepared resin mix was added to the graduated addition chamber 30. Slowly, the bleeder valve was closed to decrease the pressure inside the apparatus. This slow pressure decrease was continued until a full vacuum was achieved (approximately 1 mm $H_g$). The screw valve 33 was thereafter operated to transfer the resin mix slowly to the dropping tube 22. Spherized and partially spherized resin beads were produced on the first pass and recovered in the receiving flask 24. Additional passes, usually three, produced more uniformly spherized beads.

Following treatment of a desired quantity of resin mix, the spherizied resin beads were removed from the receiving flask and the fumed silica was dissolved using a chilled aqueous 1M sodium hydroxide solution. The beads were then thoroughly rinsed with distilled $H_2O$ then air dried after a light rinsing with isopropyl alcohol. The beads were then sieved, using appropriate sieve meshes and a ROTAP sieve-shaker device, to desired sizes and thereafter stored in a freezer.

Some of the polycarbonate resin beads produced by the process above were classified to a mesh size of +120 −100 mesh. Their glass transition temperature $T_g$ was about 40 degrees C. The bonding composition consisted of 99.9% silver-glass paste to which 0.1% of these spacer beads were added. Set forth hereafter in Table 4 are the weight percent parameters of the exact formulation of the composition that was tested:

TABLE 4

| Component | Weight Percent |
|---|---|
| Metz Ag flake 5SB | 23.67% |
| Metz Ag flake 67 | 11.86% |
| Metz Ag flake 26LV | 23.67% |
| Metz Ag flake 50-S | 11.86% |
| Ferro PbOB2O3 | 17.84% |
| TERPINEOL | 3.66% |
| TEXANOL | 3.67% |
| TEXANOL ISOBUTYRATE | 3.67% |
| QPAC Beads | 0.10% |

The paste composition (without QPAC Beads) was prepared in the same manner as the die attach paste in Example I. Thereafter, the QPAC Beads were mixed in and dispersed through the paste. The bonding composition was applied between opposing surfaces of the silicon and ceramic structures at a 5 mil wet bond line thickness (controlled by the spacer elements) and fired at a peak temperature of 390 degrees C. for eight minutes.

Set forth hereafter in Tables 5 and 6 is a comparison of the fired bond line thickness (FBL), the adhesive strength and the void rate of the die attach composition with polycarbonate spacer elements as described above in comparison to a control composition without spacers. The bond line spacing for the control paste was set to 5 mils using a test fixture having a flanged clutch micrometer adjusted to the appropriate bond line thickness. As noted, the bond line thickness for the spacer containing paste was controlled by the beads themselves. Each table includes test values for five specimens, together with the average value ($\bar{x}$) for each of the three measured characteristics. In addition, a standard deviation ($\sigma_{n-1}$) and range of adhesion values (R) are provided for the adhesion results. The results of the control test are set forth hereafter in Table 5 as follows:

TABLE 5

| (Control) | | |
|---|---|---|
| FBL | Adhesion | Void Rate |
| 3.90 | 211.0 | 1 |
| 4.10 | 210.0 | 1 |
| 3.75 | 198.0 | 1 |
| 3.40 | 189.0 | 1 |
| 3.85 | 209.0 | 1 |
| $\bar{x} = 3.80$ | $\bar{x} = 203.4$ | $\bar{x} = 1$ |
|  | $\sigma_{n-1} = 9.6$ |  |
|  | R = 189.0–211.0 |  |

TABLE 6

| (Composition With Spacers) | | |
|---|---|---|
| FBL | Adhesion | Void Rate |
| 3.70 | 188.0 | 2 |
| 3.65 | 164.0 | 2 |
| 3.45 | 177.0 | 1 |
| 3.90 | 186.0 | 2 |
| 3.80 | 182.0 | 2 |
| $\bar{x} = 3.70$ | $\bar{x} = 179.4$ | $\bar{x} = 1.8$ |
|  | $\sigma_{n-1} = 9.6$ |  |
|  | R = 164.0–188.0 |  |

The above results indicate that the polypropylene carbonate spacer composition exhibits good tensile strength, though slightly less than that of the control composition, and provides sufficient bond line thickness, though also slightly less than that of the control. In addition, the void percentage, though slightly higher than that of the control composition, is well below the 15% void ratio required by the semiconductor packaging industry. It will also be noted, as discussed above, that the bond line used in the control was set by a flange micrometer at what was considered optimum for adhesive performance. In the absence of this ability to externally maintain wet bond line thickness in the control, adhesive performance would have been compromised. The composition with spacer elements required no such external bond line control.

EXAMPLE III

Wood's Metal Spacer Elements

A rectangular silicon die having dimensions of 300×300 mils was bonded to a ceramic substrate. A bonding compositions was made by separately combining a silver-glass paste composition with collapsible spacer elements made from low melting point Wood's metal. The silver-glass paste was made from a mixture of two silver flake types obtained from Degussa Metz Co. under the designations 15ED and 26LV. The paste also included the Ferro lead borate glass frit used in Example I, and an organic solvent mixture. The organic solvents employed were TEXANOL from Eastmann Chemical Products, Inc., and ARCOSOLVE DPM and ARCOSOLVE TPM from Arco Chemical Co. A small quantity of ELVACITE 2045 polymer was also dissolved into these solvents to complete the organic vehicle. The spacer elements were produced from Wood's metal obtained from Aldrich Chemical Co.. The Wood's metal beads had a mesh size of −100 +120 mesh. Their melting temperature $T_m$ was about 70 degrees C.

The Wood's metal material is not available in spherical form. It was therefore necessary to produce Wood's metal beads for use as spacers. The process for making the beads consisted of heating the metal under a fully dispersed thixotropic slurry of 5% CAB O SILEH5 fumed silica in hexadecane. The temperature was maintained at 125 degrees C. until all of the bulk metal melted and the entire mix was subjected to a short burst of agitation from a Silverson L2R high shear mixer. The dispersion of metal beads in the slurry was then chilled with external cooling until the beads solidified. The entire mixture was classified with appropriately sized sieves and the beads were washed with isopropyl alcohol and dried.

The Wood's metal beads produced by the process above were classified to a mesh size of −100 +120 mesh. The bonding composition consisted of 99.0% silver-glass-paste to which 1.0% of these spacer beads were added. Set forth hereafter in Table 7 are the weight percent parameters of the exact formulation of the paste that was tested:

TABLE 7

| Component | Weight Percent |
|---|---|
| Metz Ag flake 15ED | 34.43% |
| Metz Ag flake 26LV | 34.43% |
| Ferro PbOB2O3 | 17.27% |
| TEXANOL | 6.24% |
| ARCOSOLVE DPM | 3.12% |
| ARCOSOLVE TPM | 3.12% |
| ELVACITE 2045 | 0.39% |
| Wood's metal beads | 1.00% |

The paste composition (without Wood's metal beads) was prepared in accordance with conventional methods for producing silver-glass die attach paste as in Example I. The Wood's metal beads were mixed in and dispersed through the paste. The bonding composition was applied between opposing surfaces of the silicon and ceramic structures at a 5 mil wet bond line thickness (controlled by the spacer elements) and fired at a peak temperature of 425 degrees C. for eight minutes.

Set forth hereafter in Tables 8 and 9 is a comparison of the fired bond line thickness (FBL), the adhesive strength and the void rate of the die attach composition sample with Wood's metal spacer elements in comparison to a control composition without spacers. The bond line spacing for the control paste was set to 5 mils using a test fixture having a flanged clutch micrometer adjusted to the appropriate bond line thickness. As noted, the bond line thickness for the spacer containing paste was controlled by the beads themselves. The tables include test values for twenty and ten specimens, respectively, together with the average value ($\bar{x}$) for each of the three measured characteristics. In addition, a standard deviation ($\sigma_{n-1}$) and range of adhesion values (R) are provided for the adhesion results. The results of the control test are set forth hereafter in Table 8, as follows:

TABLE 8

| FBL | (Control) Adhesion | Void Rate |
|---|---|---|
| 1.80 | 129 | 0 |
| 2.15 | 134 | 0 |
| 2.20 | 121 | 0 |
| 2.25 | 87 | 0 |
| 2.05 | 71 | 0 |
| 2.15 | 83 | 0 |
| 2.30 | 85 | 0 |
| 2.00 | 77 | 0 |
| 2.25 | 85 | 0 |
| 2.35 | 62 | 0 |
| 2.40 | 165 | 0 |
| 2.20 | 90 | 0 |
| 2.90 | 110 | 0 |
| 2.95 | 97 | 0 |
| 2.75 | 92 | 0 |
| 2.65 | 84 | 0 |
| 2.30 | 81 | 0 |
| 2.15 | 83 | 0 |
| 2.20 | 89 | 0 |
| 2.60 | 83 | 0 |
| $\bar{x} = 2.33$ | $\bar{x} = 95.4$ $\sigma_{n-1} = 24.7$ R = 62.0–165.0 | $\bar{x} = 0$ |

TABLE 9

| FBL | (Composition With Wood's Metal Spacers) Adhesion | Void Rate |
|---|---|---|
| 3.75 | 106 | 0 |
| 3.55 | 94 | 0 |
| 3.60 | 101 | 0 |
| 3.55 | 109 | 0 |
| 3.90 | 125 | 0 |
| 1.85 | 80 | 0 |
| 3.55 | 84 | 0 |
| 3.40 | 91 | 1 |
| 3.40 | 78 | 0 |
| 3.80 | 90 | 1 |
| x = 3.44 | x = 95.8 $\sigma_{n-1} = 14.6$ R = 78.0–125.0 | x = 0.2 |

The above results indicate that the Wood's metal spacer composition exhibits superior tensile strength and provides a bond line thickness in excess of that provided by the control composition. In addition, the void percentage, though slightly higher than that of the control, is well below the 15% void ratio required by the semiconductor packaging industry. It will also be noted, as discussed above, that the bond line used in the control was set by a clutch micrometer at what was considered optimum for adhesive performance. In the absence of this ability to externally maintain wet bond line thickness in the control, adhesive performance would have been compromised. The composition with spacer elements required no such external bond line control.

EXAMPLE IV

Metal Alloy Spacer Elements

A rectangular silicon die having dimensions of 500×500 mils was bonded to a ceramic substrate. Two bonding compositions (A and B) were prepared by mixing a silver-glass paste composition with collapsible spacer elements made from low melting point alloys. The silver-glass paste was the same as that used in Example II above. Thus, the paste composition was formed from a mixture of four silver flake types obtained from Degussa Metz Co. under the designations 5SB, 67, 26LV and 50-S. The paste also included the Ferro lead borate glass frit used in Example I, and an organic solvent mixture. The organic solvents employed were alpha terpineol from Hercules Inc., and the ester alcohol 2,2,4-trimethyl-1, 3-pentanediol isobutyrate (and its mono isobutyrate), sold under the trademarks TEXANOL and TEXANOL ISOBUTYRATE by Eastmann Chemical Products, Inc.

In composition A, the metallic spacer elements were formed from a low temperature alloy consisting of 49% Bi, 21% In, 18% Pb and 12% Sn. This alloy was processed into spherical beads by an identical method as described for the Wood's metal. The liquidus (or melting point) for this quaternary eutectic was 58 degrees C. These spacer elements were loaded into the paste at a concentration of 1.00%. The spacer size was 6–7 mils or about −80 +100 mesh. In composition B, the metallic spacer elements were formed from a low temperature alloy consisting of 52% Bi, 32% Pb and 15.5% Sn. This alloy was processed as before to yield spherical beads. The alloy melted at 95 degrees C. These spacer elements were loaded into the paste at a concentration of 1.00%. The spacer size was 6–7 mils or about −80 +100 mesh.

The bonding compositions A and B thus consisted of 99.0% of the silver-glass paste of Example II to which 1.00% of the respective spacer beads were added. The paste composition (without alloy spacers) was prepared in the same manner as the die attach paste in Example I. Thereafter, the alloy spacers were mixed in and dispersed through the paste. The bonding composition was applied between opposing surfaces of the silicon and ceramic structures at a 6–7 mil (−80 +100 mesh) wet bond line thickness (controlled by the spacer elements) and fired at a peak temperature of 390 degrees C. for eight minutes.

Set forth hereafter in Tables 10, 11 and 12 is a comparison of the fired bond line thickness (FBL), the adhesive strength and the void rate of the die attach compositions A and B with alloy spacer elements as described above in comparison to a control composition without spacers. The spacing for the control paste was set to 6.5 mils using a test fixture having a flanged clutch micrometer adjusted to the appropriate bond line thickness. As noted, the bond line thickness for each spacer containing composition was controlled by the spacers themselves. Each table includes test values for five specimens, together with the average value ($\bar{x}$) for each of the three measured characteristics. In addition, a standard deviation ($\sigma_{n-1}$) and range of adhesion values (R) are provided for the adhesion results. The results of the control test are set forth hereafter in Table 10 as follows:

TABLE 10

| FBL | (Control) Adhesion | Void Rate |
|---|---|---|
| 4.5 | 164 | 1 |
| 4.4 | 153 | 1 |
| 4.5 | 149 | 0 |
| 4.5 | 166 | 1 |
| 4.4 | 120 | 0 |
| $\bar{x} = 4.5$ | $\bar{x} = 150.4$ $\sigma_{n-1} = 18.4$ R = 120–166 | $\bar{x} = 0.6$ |

TABLE 11
(Composition With Spacers - Sample A)

| FBL | Adhesion | Void Rate |
|---|---|---|
| 6.1 | 147 | 2 |
| 5.0 | 163 | 2 |
| 5.2 | 155 | 2 |
| 5.1 | 142 | 2 |
| 5.8 | 120 | 2 |
| x = 5.4 | x = 146.8 | x = 2 |
|  | $\sigma_{n-1} = 13.6$ |  |
|  | R = 127.0–163.0 |  |

TABLE 11
(Composition With Spacers - Sample B)

| FBL | Adhesion | Void Rate |
|---|---|---|
| 6.0 | 133 | 2 |
| 6.0 | 167 | 1 |
| 5.2 | 133 | 2 |
| 5.3 | 123 | 1 |
| 5.7 | 143 | 1 |
| x = 5.6 | x = 139.8 | x = 1.4 |
|  | $\sigma_{n-1} = 16.8$ |  |
|  | R = 123.0–167.0 |  |

The above results indicate that the alloy spacer samples A and B exhibit good tensile strength and provide sufficient bond line thickness. In addition, the void percentage is well below the 15% bond ratio required by the semiconductor packaging industry. It will also be noted, as discussed above, that the bond line used in the control was set by a clutch micrometer at what was considered optimum for adhesive performance. In the absence of this ability to externally maintain wet bond line thickness in the control, adhesive performance would have been compromised. The composition with spacer elements required no such external bond line control.

Accordingly, an adhesive bonding composition with a bond line limiting spacer system has been disclosed. While various preferred embodiments have been shown and described, including embodiments directed to both epoxy and metal-glass compositions, it should be understood that modifications and adaptations thereof will occur to persons skilled in the art. Therefore, the protection afforded the invention should not be limited except in accordance with the spirit of the following claims and their equivalents.

We claim:

1. A semiconductor die-attach paste bonding composition for providing an adhesive bond between a pair of surfaces in a semiconductor device, said composition comprising:
    an adhesive paste composition having a hardenable adhesive component therein;
    a plurality of spacer elements distributed in said adhesive paste composition;
    said spacer elements being sized to provide a self-limiting bond line thickness between the surfaces to be bonded, said bond line thickness being maintained at a selected lower limit by the size of said spacer elements; and
    wherein said adhesive paste composition is a silver-glass paste for attaching a semiconductor die to a ceramic substrate and said spacer elements are collapsible balls made from Wood's metal.

2. A semiconductor die-attach paste bonding composition for providing an adhesive bond between a pair of surfaces in a semiconductor device, said composition comprising:
    an adhesive paste composition having a hardenable adhesive component therein;
    a plurality of spacer elements distributed in said adhesive paste composition;
    said spacer elements being sized to provide a self-limiting bond line thickness between the surfaces to be bonded, said bond line thickness being maintained at a selected lower limit by the size of said spacer elements; and
    wherein said adhesive paste composition is a silver-glass paste for attaching a semiconductor die to a ceramic substrate and said spacer elements are collapsible balls made from an alloy consisting of 49% Bi, 21% In, 18% Pb, and 12% Sn, by weight.

3. A semiconductor die-attach paste bonding composition for providing an adhesive bond between a pair of surfaces in a semiconductor device, said composition comprising:
    an adhesive paste composition having a hardenable adhesive component therein;
    a plurality of spacer elements distributed in said adhesive paste composition;
    said spacer elements being sized to provide a self-limiting bond line thickness between the surfaces to be bonded, said bond line thickness being maintained at a selected lower limit by the size of said spacer elements; and
    wherein said adhesive paste composition is a silver-glass paste for attaching a semiconductor die to a ceramic substrate and said spacer elements are collapsible balls made from an alloy consisting of 52% Bi, 32% Pb, and 15.5% Sn, by weight.

4. A semiconductor die-attach paste bonding composition for providing an adhesive bond between a pair of surfaces in a semiconductor device, said composition comprising:
    an adhesive paste composition having a hardenable adhesive component therein;
    a plurality of spacer elements distributed in said adhesive paste composition;
    said spacer elements being sized to provide a self-limiting bond line thickness between the surfaces to be bonded, said bond line thickness being maintained at a selected lower limit by the size of said spacer elements; and
    wherein said adhesive paste composition is a silver-glass paste for attaching a semiconductor die to a ceramic substrate and said spacer elements are collapsible plastic balls.

5. A semiconductor die-attach paste bonding composition for providing an adhesive bond between a pair of surfaces in a semiconductor device, said composition comprising:
    an adhesive paste composition having a hardenable adhesive component therein;
    a plurality of spacer elements distributed in said adhesive paste composition;
    said spacer elements being sized to provide a self-limiting bond line thickness between the surfaces to be bonded, said bond line thickness being maintained at a selected lower limit by the size of said spacer elements; and
    wherein said adhesive paste composition is a silver-glass paste for attaching a semiconductor die to a ceramic substrate and said spacer elements are collapsible balls made from polypropylene carbonate, said adhesive paste composition further including a compatible combination of one or more organic compounds.

6. A semiconductor die-attach paste bonding composition for providing an adhesive bond between a pair of surfaces in a semiconductor device, said composition comprising:

an adhesive paste composition having a hardenable adhesive component therein;

a plurality of spacer elements distributed in said adhesive paste composition;

said spacer elements being sized to provide a self-limiting bond line thickness between the surfaces to be bonded, said bond line thickness being maintained at a selected lower limit by the size of said spacer elements; and wherein said adhesive vehicle is a silver-glass paste for attaching a semiconductor die to a ceramic substrate, said spacer elements are collapsible balls made from polypropylene carbonate, and said adhesive paste composition includes an organic solvent.

7. A semiconductor die-attach paste bonding composition for providing an adhesive bond between a pair of surfaces in a semiconductor device, said composition comprising:

an adhesive paste composition having a hardenable adhesive component therein;

a plurality of spacer elements distributed in said adhesive paste composition;

said spacer elements being sized to provide a self-limiting bond line thickness between the surfaces to be bonded, said bond line thickness being maintained at a selected lower limit by the size of said spacer elements; and wherein said adhesive paste composition is a silver-glass paste, including an organic vehicle, for attaching a semiconductor die to a ceramic substrate, said spacer elements are collapsible balls made from polyisobutyl methacrylate, and said organic vehicle of said adhesive paste composition consists of siloxane fluids.

8. A semiconductor die-attach paste bonding composition for attaching a semiconductor die to a ceramic substrate, the bonding composition comprising:

an adhesive paste composition consisting of:

approximately 60 to 85 percent silver;

approximately 7 to 20 percent glass frit having a softening temperature of less than about 400° C.;

approximately 0 to 2 percent resin;

approximately 6 to 20 percent organic solvent (or organic non-solvent); and approximately 0.1 percent collapsible spacer elements distributed in said adhesive paste composition 9. The bonding composition of claim 8 wherein said spacer elements are made from a collapsible, non-charring, depolymerizable, solvent-resistant material.

10. The bonding composition of claim 8 wherein said spacer elements are made from a low melting point alloy.

* * * * *